(12) United States Patent
Miyazaki (10) Patent No.: US 7,502,402 B2
(45) Date of Patent: Mar. 10, 2009

(54) INTEGRATED OPTICAL SEMICONDUCTOR DEVICE

(75) Inventor: Yasunori Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 19 days.

(21) Appl. No.: 11/539,879

(22) Filed: Oct. 10, 2006

(65) Prior Publication Data
US 2007/0086500 A1 Apr. 19, 2007

(30) Foreign Application Priority Data
Oct. 13, 2005 (JP) ............... 2005-299413

(51) Int. Cl.
*H01S 5/00* (2006.01)
(52) U.S. Cl. ............... 372/50.22; 372/50.11; 372/50.1
(58) Field of Classification Search ............ 372/50.22, 372/50.11, 50.1
See application file for complete search history.

(56) References Cited

U.S. PATENT DOCUMENTS 5,502,316 A * 3/1996 Kish et al. ............... 257/94
6,516,017 B1 * 2/2003 Matsumoto ............... 372/50.11
2005/0006654 A1 * 1/2005 Kang et al. ............... 257/80

FOREIGN PATENT DOCUMENTS

JP  2002-277826  9/2002

* cited by examiner

*Primary Examiner*—Minsun Harvey
*Assistant Examiner*—Kinam Park
(74) *Attorney, Agent, or Firm*—Leydig, Voit & Mayer, Ltd.

(57) ABSTRACT

A semiconductor laser device includes a semiconductor laser portion, a window layer structure portion, a first inter-element portion, and a pre-placed optical element portion on an InP substrate. The semiconductor laser portion includes an InGaAsP layer and an InP layer located on the InGaAsP layer. The window layer structure portion of a double heterojunction structure has the same optical axis direction as the semiconductor laser portion and is located apart from the semiconductor laser portion. The first inter-element portion has a 100-μm or less thickness in an optical axis direction, is in contact with an end face on a side of the window layer structure portion adjacent to the semiconductor laser portion and includes an InGaAsP layer and an InP layer of the same layer configuration as the semiconductor laser portion. The pre-placed optical element portion of the double heterojunction structure has a first end face in contact with the first inter-element portion and a second end face mutually opposed to the first end face and in contact with one end face of the semiconductor laser portion.

6 Claims, 8 Drawing Sheets

INTEGRATED OPTICAL SEMICONDUCTOR DEVICE

BACKGROUND OF THE INVENTION

1. Field of the Invention

The present invention relates to an integrated optical semiconductor device and a manufacturing method thereof, and particularly to an integrated optical semiconductor device monolithically formed by opposing and joining three or more kinds of optical elements in an optical axis direction and a manufacturing method thereof.

2. Description of the Related Art

In recent years, there is increasing demand for transmitting vast amounts of information at low cost as broadband communications makes progress and a public telecommunication network using an optical fiber prevails. To increase the amounts of information transmitted according to such demand, it is necessary to improve a transmission rate. The transmission rate is gradually sped up from 600 Mbps to 2.5 Gbps and further to 10 Gbps.

Due to such improvement in the transmission rate of optical communication devices, optical communication networks expanded their markets to access systems such as offices and households in addition to trunk-line systems, and light emitting and light receiving devices used for optical transmitters and receivers are required to be high-speed, low-cost and efficient.

To configure an optical semiconductor device for optical communications at low cost, there are an optical modulator integrated semiconductor laser device, an optical amplifier integrated semiconductor laser device and the like which are monolithically integrated for instance.

These integrated optical semiconductor devices comprise a semiconductor laser, an optical semiconductor device such as an optical modulator or an optical amplifier pre-placed on the semiconductor laser by sharing an optical axis with the semiconductor laser, and a window layer structure portion pre-placed by sharing the optical axis with these optical devices.

The semiconductor laser, various optical devices and window layer structure portion configuring these integrated optical semiconductor devices are configured by opposing and joining (called butt-joint hereafter) the three different kinds of laminated structure as basic configurations of the optical devices having their respective functions to share one optical axis.

To describe the optical modulator integrated semiconductor laser device for instance, each of the semiconductor laser, the optical modulator pre-placed on (or located in front of) the semiconductor laser and the window layer structure portion pre-placed on the optical modulator has a double hetero junction structure consisting of InP/InGaAsP/InP for instance in terms of the basic configuration.

The semiconductor laser has the double hetero junction structure including an InGaAsP layer epitaxially grown on an InP substrate and an InP layer epitaxially grown on the InGaAsP layer as a basic laminated structure for instance.

The optical modulator has the double hetero junction structure including an InGaAsP layer epitaxially grown on an InP substrate and an InP layer epitaxially grown on the InGaAsP layer as the basic laminated structure for instance.

The window layer structure portion has the double hetero junction structure including an InP layer epitaxially grown on an InP substrate, an InGaAsP layer epitaxially grown on the InP layer and an InP layer epitaxially grown on the InGaAsP layer as the basic laminated structure for instance. As for the basic laminated structures of the three optical elements, each of the laminated structures is joined by butt-joint on the InP substrate which is common.

As for a heretofore known example of such a semiconductor integrated optical circuit which is monolithically integrated, there is a disclosed example which is configured by the semiconductor laser, a dilute magnetic semiconductor (DMS) layer and liquid crystal polarizers provided at both ends thereof and monolithically configures an optical isolator and an optical waveguide.

To describe the method of forming the semiconductor integrated optical circuit, it sequentially forms a DFB laser including a cladding layer consisting of a diffraction grating formed on a substrate, an InGaAsP active layer formed thereon and InP formed thereon, an optical isolator region including a DMS layer consisting of a dilute magnetic semiconductor layer of an (InGaMn) As system having the same optical axis as the DFB laser and a cladding layer consisting of InP, and an optical waveguide including an optical waveguide layer consisting of InGaAsP also having the same optical axis and a cladding layer consisting of InP, and forms concave places by etching on a boundary between a DFB laser region and the optical isolator region and a boundary between the optical isolator region and the optical waveguide so as to form the liquid crystal polarizers there (refer to paragraph numbers [0019] to [0035] and FIGS. 1 to 4 of Japanese Patent Laid-Open No. 2002-277826).

For instance, the following manufacturing method was used to form the aforementioned basic laminated structures of the three optical elements such as the optical modulator integrated semiconductor laser device having the double hetero junction structure consisting of InP/InGaAsP/InP for instance respectively.

First, a first InGaAsP layer and a first InP layer as the basic laminated structure of the semiconductor laser sequentially are formed on the InP substrate by epitaxial growth.

Next, an silicon oxide film is formed on the surface of the first InP layer, and also a first silicon oxide film pattern is formed, the first silicon oxide film pattern including an opening in a portion corresponding to a region including the window layer structure portion located at the most front end on the optical axis and of a length allowing a margin a little further in the optical axis direction. With the first silicon oxide film pattern as a mask, the first InP layer is completely eliminated by nonselective etching such as dry etching using a reactive ion for instance in the depth control based on etching time. Subsequently, selective etching is carried out by using an etchant such as tartaric acid rapidly reactive to InGaAsP and slowly reactive to InP so as to eliminate the first InP layer and the first InGaAsP layer with good etching depth control.

Next, with the first silicon oxide film pattern as the mask, a second InP layer, a second InGaAsP layer and a third InP layer as the basic laminated structure of the window layer structure portion sequentially are formed by the epitaxial growth to perform embedding growth. In this case, a first butt-joint is formed so that the basic laminated structure including the window layer structure portion and the basic laminated structure of the semiconductor laser share the optical axis.

Next, the basic laminated structure of the optical modulator portion is formed. First, the first silicon oxide film pattern is eliminated, a silicon oxide film is formed on the surfaces of the basic laminated structure including the window layer structure portion and the basic laminated structure of the semiconductor laser, and a second silicon oxide film pattern is formed, the second silicon oxide film pattern including an opening in the portion corresponding to the optical modulator located between the window layer structure portion and the semiconductor laser and sharing the optical axis with them. A part of the basic laminated structure of the window layer structure portion and a part of the basic laminated structure of the semiconductor laser formed earlier are included in the opening of the second silicon oxide film pattern. Therefore, the first butt-joint exists in the opening.

Next, the etching is performed with the second silicon oxide film pattern as the mask. As described above, the opening of the second silicon oxide film pattern includes a part of the basic laminated structure of the window layer structure portion and a part of the basic laminated structure of the semiconductor laser. Therefore, it is not possible to carry out the nonselective etching as performed on forming the window layer structure portion, which is performed by the selective etching, thereby to stop the etching with high-precision etching depth control.

To be more specific, it is possible to use the selective etching using the tartaric acid to a part of the basic laminated structure of the semiconductor laser because it has the InGaAsP layer on the InP substrate. However, it is not possible to use the selective etching using the tartaric acid to a part of the basic laminated structure of the window layer structure portion because it has the InP layer formed by the epitaxial growth existing on the InP substrate. For this reason, the nonselective etching has to be performed and etching depth has to be controlled by etching time when performing etching with the second silicon oxide film pattern as the mask.

Consequently, the etching depth is influenced by variations in reaction rate, such as variations of ±20% or so.

Therefore, in the case of forming the InGaAsP layer and InP layer as the basic laminated structure of the optical modulator on the InP substrate by the embedding growth with the second silicon oxide film pattern as the mask after the etching, a relative position of the basic laminated structure of the optical modulator on the InP substrate in a lamination direction deviates from the relative positions of the basic laminated structures of the semiconductor laser and window layer structure portion on the InP substrate.

As regards the optical modulator integrated semiconductor laser device for instance, there arises a situation where a deviation occurs between an active layer of the semiconductor laser and an absorbing layer of the optical modulator so that optical modulation is not efficiently performed. This also applies to the optical amplifier integrated semiconductor laser device, and a high-efficiency optical amplifier integrated semiconductor laser device is not formed.

Thus, the conventional manufacturing method had a problem that, in the case of monolithically forming three or more optical elements having different double hetero basic laminated structures by the butt-joint, it was difficult to integrate optical semiconductor elements without the deviations of the relative positions in a layer thickness direction from the substrate with good controllability.

SUMMARY OF THE INVENTION

The present invention has been made to solve the problem, and a first object thereof is to configure an integrated optical semiconductor device which is highly efficient in operation and low-cost and has three or more optical elements opposed and joined in the optical axis direction. A second object thereof is to provide a manufacturing method for integrating the integrated optical semiconductor device having the three or more kinds of optical elements opposed and joined in the optical axis direction with good controllability.

According to one aspect of the invention, there is provided a integrated optical semiconductor device according to the present invention comprises: a semiconductor substrate; a first optical semiconductor element structure including a first laminated structure consisting of one layer or multiple layers selectively located on the semiconductor substrate with heterojunction to the semiconductor substrate and a second laminated structure consisting of one layer or multiple layers located on the first laminated structure with heterojunction to the first laminated structure, the first laminated structure having a higher etching rate than the etching rate of the semiconductor substrate to a predetermined etchant; a second optical semiconductor element structure of the double hetero structure having the same optical axis direction as the first optical semiconductor element structure, having an first end face orthogonal to the optical axis on a side closer to the first optical semiconductor element structure, and located on the semiconductor substrate apart from the first optical semiconductor element structure; an inter-optical semiconductor element structure in close contact with the first end face, located on the semiconductor substrate, having the first laminated structure and second laminated structure with a thickness of 100 μm or less in the optical axis direction, and having an second end face orthogonal to the optical axis on a side closer to the first optical semiconductor element structure; and a third optical semiconductor element structure of the double hetero structure in close contact with the second end face located on the semiconductor substrate, and having the same optical axis direction as the first optical semiconductor element structure.

Accordingly, in the integrated optical semiconductor device according to the present invention, the deviations are reduced between the optical axis of the third optical semiconductor element structure and the optical axes of first and second optical semiconductor element structures. As losses due to the deviations of the optical axis are reduced, it is possible to obtain the integrated optical semiconductor device of a simple configuration, low cost and high operation efficiency.

According to another aspect of the invention, there is provided a manufacturing method of the integrated optical semiconductor device according to the present invention includes: forming a first laminated structure consisting of one layer or multiple layers selectively on a semiconductor substrate with heterojunction to the semiconductor substrate and forming a second laminated structure consisting of one layer or multiple layers on the first laminated structure with heterojunction to the first laminated structure, the first laminated structure having a higher etching rate than the etching rate of the semiconductor substrate to a predetermined etchant; forming a first mask pattern having an opening in a predetermined shape on a surface of the second laminated structure, performing nonselective etching with the first mask pattern as an etching mask to a depth beyond a boundary between the second laminated structure and the first laminated structure, and then selectively etching the first laminated structure by using the predetermined etchant with the first mask pattern as the etching mask until the semiconductor substrate is exposed, and further forming a second optical semiconductor element structure with double hetero structure on the exposed semiconductor substrate and filling the etched portion with the first mask pattern as the mask; forming a second mask pattern covering the surfaces of the second optical semiconductor element structure and the second laminated structure and including an opening, the opening having one edge extended parallel to a boundary between the second optical semiconductor element structure and the second laminated structure getting into the second laminated structure from the boundary at a distance of 1 μm to 100 μm and an opposite edge at a predetermined distance from the one edge, performing nonselective etching with the second mask pattern as the etching mask to a depth beyond a boundary between the second laminated structure and the first laminated structure, selectively etching the first laminated structure by using the predetermined etchant with the second mask pattern as the etching mask until the semiconductor substrate is exposed so as to form an inter-optical semiconductor element structure in close contact with the second optical semiconductor element structure; and forming a third optical semiconductor element structure of the double hetero structure by embedding growth in close contact with the inter-optical semiconductor element structure with the second mask pattern as the mask on the semiconductor substrate exposed by the etching.

Accordingly, in the manufacturing method of the integrated optical semiconductor device according to the present invention, in its etching process in the case of forming the third optical semiconductor element structure, it is possible, by forming the inter-optical semiconductor element structure, to perform the nonselective etching and the selective etching following the nonselective etching with the second mask pattern as the etching mask as with the etching in the process of forming the second optical semiconductor element structure so as to accurately control the etching depth. For this reason, the third optical semiconductor element structure formed by performing the embedding growth with the second mask pattern as the mask is formed with reduced position errors in the thickness direction thereof. And the deviations are reduced between the optical axis of the third optical semiconductor element structure and the optical axes of first and second optical semiconductor element structures located in front and in rear of the third optical semiconductor element structure. In addition, the yield is improved. Therefore, the losses due to the deviation of the optical axis are reduced as to the integrated optical semiconductor device according to this manufacturing method, and so it is possible to obtain the integrated optical semiconductor device of a simple configuration, low cost and high operation efficiency.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

FIG. 8 is a sectional view of the window layer structure portion 14 at the section orthogonal to the optical axis of a laser beam.

FIG. 9 is a sectional view of the optical modulator 181 at the section orthogonal to the optical axis of the laser beam.

In all figures, the substantially same elements are given the same reference numbers.

DESCRIPTION OF THE PREFERRED EMBODIMENTS

First Embodiment

Figure 1:
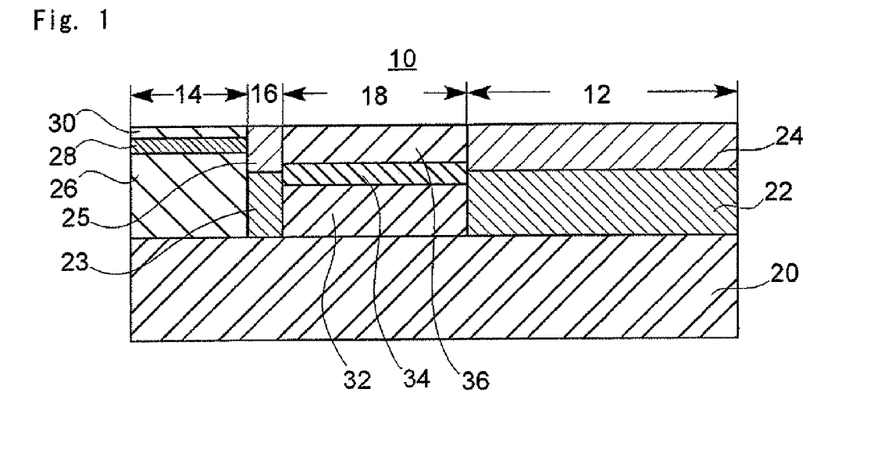
FIG. 1 is a sectional view showing a basic laminated structure of an integrated optical semiconductor device according to an embodiment of the present invention.

FIG. 1 is a sectional view showing a basic laminated structure of an integrated optical semiconductor device according to an embodiment of the present invention. In the following drawings, the same symbols represent the same or equivalent articles.

The sectional view of a basic laminated structure 10 of the integrated optical semiconductor device of FIG. 1 is the sectional view of a section parallel to a waveguide direction of a semiconductor laser.

The basic laminated structure 10 is configured as a basic laminated structure consisting of a semiconductor laser portion 12 as a first optical semiconductor element structure, a window layer structure portion 14 as a second optical semiconductor element structure located at the most front end in a light emitting direction of the basic laminated structure 10, a first inter-element portion 16 as an inter-optical semiconductor element structure in close contact with the window layer structure portion 14, a pre-placed optical element portion 18 as a third optical semiconductor element structure having an end face on its light emitting side in close contact with the first inter-element portion 16 and an end face on its light input side in close contact with an emitting end face of the semiconductor laser portion 12, such as the optical modulator or the optical amplifier.

The semiconductor laser portion 12 is configured by an InGaAsP layer 22 for instance consisting of one layer or multiple layers as a first laminated structure hetero-junctioned on an InP substrate 20, for instance, as a semiconductor substrate and an InP layer 24 for instance consisting of one layer or multiple layers as a second laminated structure hetero-junctioned on the InGaAsP layer 22.

The window layer structure portion 14 is configured by an InP layer 26 for instance as a semiconductor layer located on the InP substrate 20, an InGaAsP layer 28 consisting of one layer or multiple layers as a third laminated structure hetero-junctioned on the InP layer 26, and an InP layer 30 for instance consisting of one layer or multiple layers as a fourth laminated structure hetero-junctioned on the InGaAsP layer 28.

The first inter-element portion 16 is a laminated structure laminated in the same process as the semiconductor laser portion 12 and configured by an InGaAsP layer 23 hetero-junctioned on the InP substrate 20 and an InP layer 25 hetero-junctioned on the InGaAsP layer 23. Its thickness in the waveguide direction is 100 μm or less, which is a thickness of 1 μm to 100 μm, desirably 2 μm to 10 μm, and more preferably 2 μm to 5 μm considering an actual formation process.

The first inter-element portion 16 increases an optical loss if its thickness increases. However, it does not occur a particular significant loss at the thickness of 100 μm or less.

The pre-placed optical element portion 18 is configured by an InP layer 32 for instance located on the InP substrate 20, an InGaAsP layer 34 consisting of one layer or multiple layers as a fifth laminated structure hetero-junctioned on the InP layer 32, and an InP layer 36 for instance consisting of one layer or multiple layers as a sixth laminated structure hetero-junctioned on the InGaAsP layer 34.

A manufacturing method of the basic laminated structure 10 will be described.

FIGS. 2, 3, 4 and 5 are sectional views of the basic laminated structures in one steps of the manufacturing method of the basic laminated structures of the integrated optical semiconductor device according to an embodiment of the present invention.

Figure 2:
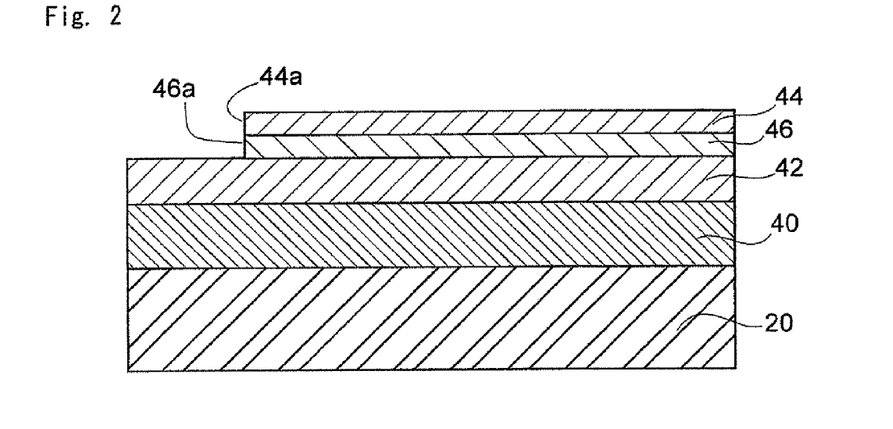
FIGS. 2, 3, 4 and 5 are sectional views of the basic laminated structures in one steps of the manufacturing method of the basic laminated structures of the integrated optical semiconductor device according to an embodiment of the present invention.

First, with reference to FIG. 2, an InGaAsP layer 40 having the same configuration as the InGaAsP layer 22 and an InP layer 42 having the same configuration as the InP layer 24 are sequentially formed on the InP substrate 20 by epitaxial growth.

Next, an silicon oxide film is formed on the surface of the InP layer 42 and a resist film is applied to the surface of the silicon oxide film. Thereafter, by appling an interference exposure method, a resist pattern 44 is formed, the resist pattern 44 having an opening 44a in a portion corresponding to a region for forming the window layer structure portion 14 located at the most front end on the optical axis. By etching with the resist pattern 44 as a mask, an silicon oxide film pattern 46 is formed, the silicon oxide film pattern 46 having an opening 46a in the portion corresponding to the region for forming the window layer structure portion 14. FIG. 2 shows a result of this process.

Figure 3:
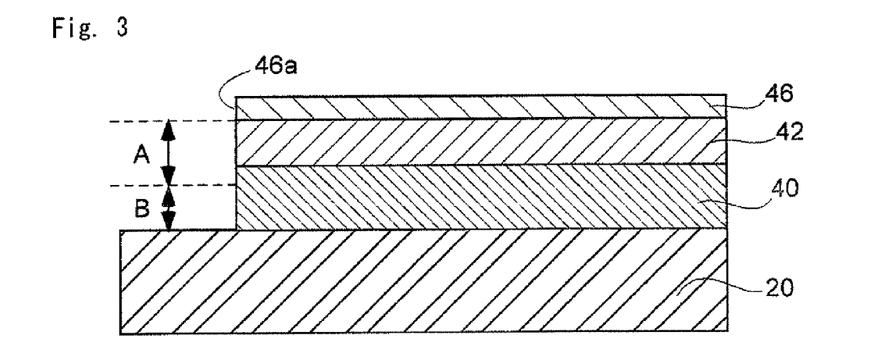

With reference to FIG. 3, the resist pattern 44 is eliminated in the next and then the InP layer 42 is completely eliminated with the silicon oxide film pattern 46 as the mask by nonselective etching such as dry etching using reactive ion for instance, further a part of the thickness on a top surface side of the InGaAsP layer 40 is eliminated by exerting etching in the depth control based on etching time to a depth for etching. A region A of FIG. 3 indicates the region etched by the nonselective etching.

Furthermore, the rest of the InGaAsP layer 40 is subsequently eliminated by selective etching with an etchant such as tartaric acid. As the tartaric acid is an etchant rapidly reactive to InGaAsP and slowly reactive to InP so that it is selective between the InGaAsP layer 40 and the InP substrate 20. For this reason, the selective etching is possible, and the etching depth is prescribed more accurately by performing the selective etching than exerting in the control based on etching time. A region B of FIG. 3 indicates the region etched by the selective etching.

Figure 4:
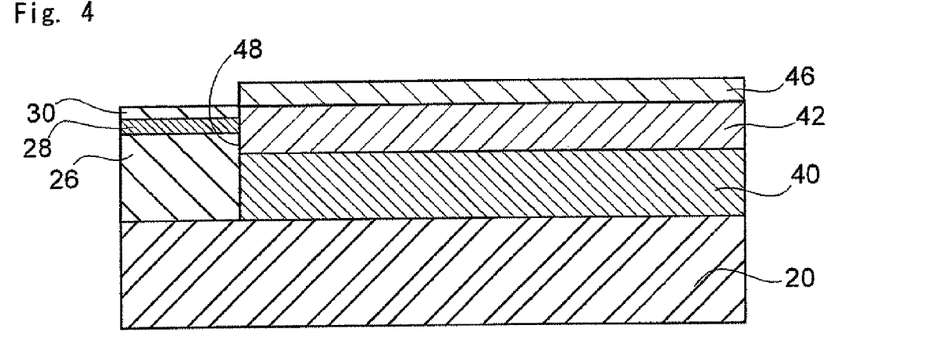

With reference to FIG. 4, in the next the InP layer 26, InGaAsP layer 28 and InP layer 30 of the window layer structure portion 14 are sequentially formed and filled on InP substrate 20 by epitaxial growth with the silicon oxide film pattern 46 as the mask. In this case, a first butt-joint 48 is formed so that the window layer structure portion 14 and the semiconductor laser portion 12 share the optical axis.

Next, the pre-placed optical element portion 18 is formed.

Figure 5:
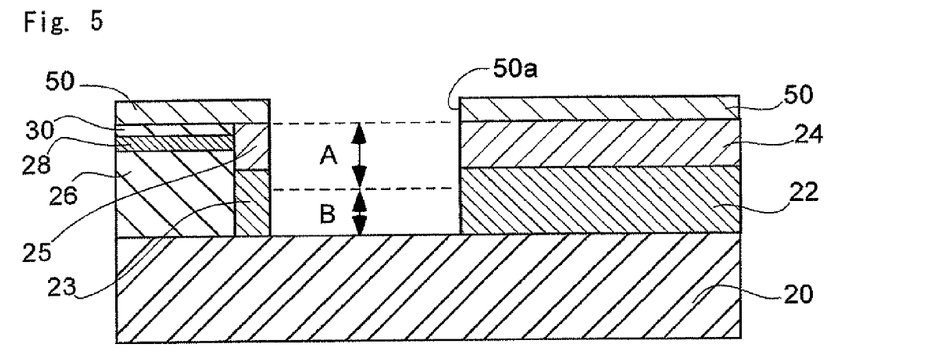

With reference to FIG. 5, the silicon oxide film pattern 46 is eliminated, a silicon oxide film is formed on the surfaces of the InP layer 30 of the window layer structure portion 14 and InP layer 42 and a resist film is applied to the surface of the silicon oxide film. Thereafter, by appling the interference exposure method, a resist pattern is formed, the resist pattern having an opening in the portion corresponding to the region for forming the pre-placed optical element portion 18 and covering the InP layer 30 of the window layer structure portion 14 and the portion corresponding to the region for forming the first inter-element portion 16. By etching with the resist pattern as the mask, an silicon oxide film pattern 50 is formed. The silicon oxide film pattern 50 covers the InP layer 30 of the window layer structure portion 14 and the portion corresponding to the region for forming the first inter-element portion 16, and has an opening 50a in the portion corresponding to the region for forming the pre-placed optical element portion 18.

The opening 50a has one edge and the opposite edge, the one edge gets into the InP layer 42 from the butt-joint 48 by a distance of 2 μm to 5 μm, for instance, while in parallel with the butt-joint 48 and the opposite edge is formed at a distance apart from the one edge by the length in the optical axis direction of the pre-placed optical element portion 18.

Therefore, the portions forming the butt-joint 48 and the first inter-element portion 16 are covered by the silicon oxide film pattern 50.

Next, the InP layer 42 is completely eliminated by the nonselective etching such as dry etching using reactive ion, for instance, with the silicon oxide film pattern 50 as the mask, further a part of the thickness of the top surface side of the InGaAsP layer 40 is eliminated by exerting the etching in the depth control based on the etching time to a depth for etching. A region A of FIG. 5 indicates the region etched by the nonselective etching.

Furthermore, the rest of the InGaAsP layer 40 is subsequently eliminated by the selective etching with an etchant such as the tartaric acid. As the etching is the selective etching, the etching depth is prescribed more accurately than that in the control based on etching time. A region B of FIG. 5 indicates the region etched by the selective etching. The InGaAsP layer 22 and InP layer 24 of the semiconductor laser portion 12 are thereby formed. FIG. 5 shows the result of this process.

Next, the InP layer 32, the InGaAsP layer 34 consisting of one layer or multiple layers hetero-junctioned on the InP substrate 32 and the InP layer 36 consisting of one layer or multiple layers hetero-junctioned on the InGaAsP layer 34 is sequentially formed and filled on the surface of the InP substrate 20.exposed by etching by means of the epitaxial growth with the silicon oxide film pattern 50 as the mask. In this case, the butt-joints are formed so that the pre-placed optical element portion 18, first inter-element portion 16 and semiconductor laser portion 12 share the optical axis. Consequently, the basic laminated structure 10 of the integrated optical semiconductor device shown in FIG. 1 is formed. A predetermined semiconductor layer is further laminated on the basic laminated structure 10 so as to be configured as the integrated optical semiconductor device.

As for the etching on forming the pre-placed optical element portion 18 according to the manufacturing method of the integrated optical semiconductor device, the nonselective etching is performed first and then the selective etching can be carried out by using selectivity between InGaAsP and InP as with the etching of the region for forming the window layer structure portion 14. Therefore, controllability of the etching depth is improved.

Consequently, the pre-placed optical element portion 18 formed by a lamination process performed following the etching can be formed with reduced position errors in the thickness direction of a lamination layer. Therefore, the pre-placed optical element portion 18 has little deviation of the optical axis from the window layer structure portion 14 and the semiconductor laser portion 12 located in front and in rear of the pre-placed optical element portion 18. Yield is also improved.

Therefore, the integrated optical semiconductor device configured based on the basic laminated structure 10 has losses due to deviations of the optical axis reduced, and so it is possible to obtain the integrated optical semiconductor device of a simple configuration, low cost and high operation efficiency.

The first embodiment described the integrated optical semiconductor device including the three optical elements of the window layer structure portion 14, pre-placed optical element portion 18 and semiconductor laser portion 12. However, it is possible, by repeating the process of forming the first inter-element portion 16 and pre-placed optical element portion 18, to form multiple pre-placed optical element portions before the semiconductor laser portion 12 so as to accurately form the integrated optical semiconductor device having even more optical elements located therein by the same manufacturing method.

As described above, the integrated optical semiconductor device according to this embodiment comprises a semiconductor substrate; a first optical semiconductor element structure including a first laminated structure consisting of one layer or multiple layers selectively located on the semiconductor substrate with heterojunction to the semiconductor substrate and a second laminated structure consisting of one layer or multiple layers located on the first laminated structure with heterojunction to the first laminated structure, the first laminated structure having a higher etching rate than the etching rate of the semiconductor substrate to a predetermined etchant; a second optical semiconductor element structure of the double hetero structure having the same optical axis direction as the first optical semiconductor element structure, having an first end face orthogonal to the optical axis on a side closer to the first optical semiconductor element structure, and located on the semiconductor substrate apart from the first optical semiconductor element structure; an inter-optical semiconductor element structure in close contact with the first end face, located on the semiconductor substrate, having the first laminated structure and second laminated structure with a thickness of 100 μm or less in the optical axis direction, and having an second end face orthogonal to the optical axis on a side closer to the first optical semiconductor element structure; and a third optical semiconductor element structure of the double hetero structure in close contact with the second end face located on the semiconductor substrate, and having the same optical axis direction as the first optical semiconductor element structure.

Therefore, the deviations are reduced between the optical axis of the third optical semiconductor element structure and the optical axes of first and second optical semiconductor element structures. As losses due to the deviations of the optical axis are reduced, it is possible to obtain the integrated optical semiconductor device of a simple configuration, low cost and high operation efficiency.

The manufacturing method of the integrated optical semiconductor device according to this embodiment includes forming a first laminated structure consisting of one layer or multiple layers selectively on a semiconductor substrate with heterojunction to the semiconductor substrate and forming a second laminated structure consisting of one layer or multiple layers on the first laminated structure with heterojunction to the first laminated structure, the first laminated structure having a higher etching rate than the etching rate of the semiconductor substrate to a predetermined etchant; forming a first mask pattern having an opening in a predetermined shape on a surface of the second laminated structure, performing nonselective etching with the first mask pattern as an etching mask to a depth beyond a boundary between the second laminated structure and the first laminated structure, and then selectively etching the first laminated structure by using the predetermined etchant with the first mask pattern as the etching mask until the semiconductor substrate is exposed, and further forming a second optical semiconductor element structure with double hetero structure on the exposed semiconductor substrate and filling the etched portion with the first mask pattern as the mask; forming a second mask pattern covering the surfaces of the second optical semiconductor element structure and the second laminated structure and including an opening, the opening having one edge extended parallel to a boundary between the second optical semiconductor element structure and the second laminated structure getting into the second laminated structure from the boundary at a distance of 1 μm to 100 μm and an opposite edge at a predetermined distance from the one edge, performing nonselective etching with the second mask pattern as the etching mask to a depth beyond a boundary between the second laminated structure and the first laminated structure, selectively etching the first laminated structure by using the predetermined etchant with the second mask pattern as the etching mask until the semiconductor substrate is exposed so as to form an inter-optical semiconductor element structure in close contact with the second optical semiconductor element structure; and forming a third optical semiconductor element structure of the double hetero structure by embedding growth in close contact with the inter-optical semiconductor element structure with the second mask pattern as the mask on the semiconductor substrate exposed by the etching.

According to the manufacturing method of the integrated optical semiconductor device, in its etching process in the case of forming the third optical semiconductor element structure, it is possible, by forming the inter-optical semiconductor element structure, to perform the nonselective etching and the selective etching following the nonselective etching with the second mask pattern as the etching mask as with the etching in the process of forming the second optical semiconductor element structure so as to accurately control the etching depth.

For this reason, the third optical semiconductor element structure formed by performing the embedding growth with the second mask pattern as the mask is formed with reduced position errors in the thickness direction thereof. And the deviations are reduced between the optical axis of the third optical semiconductor element structure and the optical axes of first and second optical semiconductor element structures located in front and in rear of the third optical semiconductor element structure. In addition, the yield is improved. Therefore, the losses due to the deviation of the optical axis are reduced as to the integrated optical semiconductor device according to this manufacturing method, and so it is possible to obtain the integrated optical semiconductor device of a simple configuration, low cost and high operation efficiency.

Second Embodiment

Figure 6:
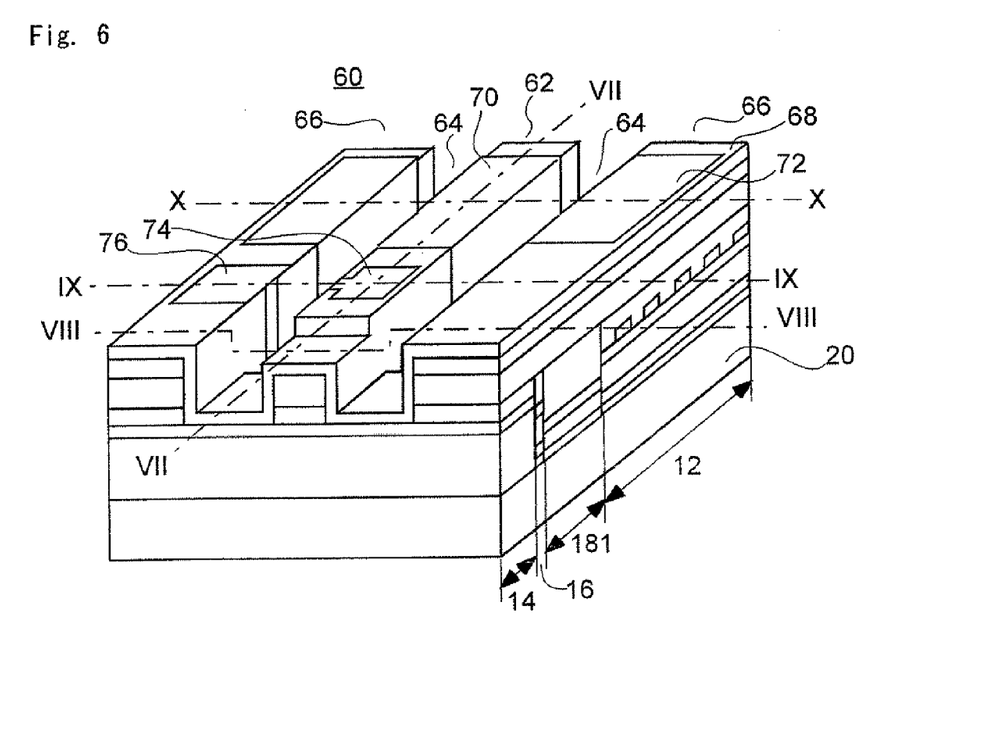
FIG. 6 is a perspective view of the integrated optical semiconductor device according to an embodiment of the present invention.

FIG. 6 is a perspective view of the integrated optical semiconductor device according to an embodiment of the present invention.

In FIG. 6, an optical modulator integrated semiconductor laser device 60 as the integrated optical semiconductor device is configured by the semiconductor laser portion 12, the window layer structure portion 14 located at the most front end in the light emitting direction, the first inter-element portion 16 in close contact with the window layer structure portion 14, and the pre-placed optical element portion 18 having the end face on its light emitting side in close contact with the first inter-element portion 16 and the end face on its light input side in close contact with the emitting end face of the semiconductor laser portion 12, that is, an optical modulator 181 according to the second embodiment.

The optical modulator integrated semiconductor laser device 60 has an optical element ridge portion 62 formed like a ridge in a central portion on the InP substrate 20 of an n conductivity type (the "n conductivity type" is described as "n-," "p conductivity type" is described as "p-," and the one having no impurities added thereto is described as "i-" hereafter). The optical element ridge portion 62 is formed by butt-jointing the window layer structure portion 14, the first inter-element portion 16, the optical modulator 181 and the semiconductor laser portion 12 sequentially from the light emitting end face side. On the n-InP substrate 20, electrode pad bases 66 are formed on both sides of the optical element ridge portion 62 via isolation grooves 64. The surfaces of the optical element ridge portion 62, isolation grooves 64 and electrode pad bases 66 are covered by an insulating film 68.

A p-electrode 70 of the semiconductor laser portion 12 is located on the surface of the semiconductor laser portion 12 of the optical element ridge portion 62. The p-electrode 70 is extended from the optical element ridge portion 62 to the electrode pad bases 66 by way of the surfaces of the isolation grooves 64, and is connected to a semiconductor laser electrode pad 72 placed on the surfaces of the electrode pad bases 66.

A high-potential electrode 74 of the optical modulator 181 is placed on the surface of the optical modulator 181 of the optical element ridge portion 62, and is extended to the electrode pad bases 66 by way of the surfaces of the isolation grooves 64 to be connected to a high-potential electrode pad 76 located on the surface of the electrode pad bases 66.

Figure 7:
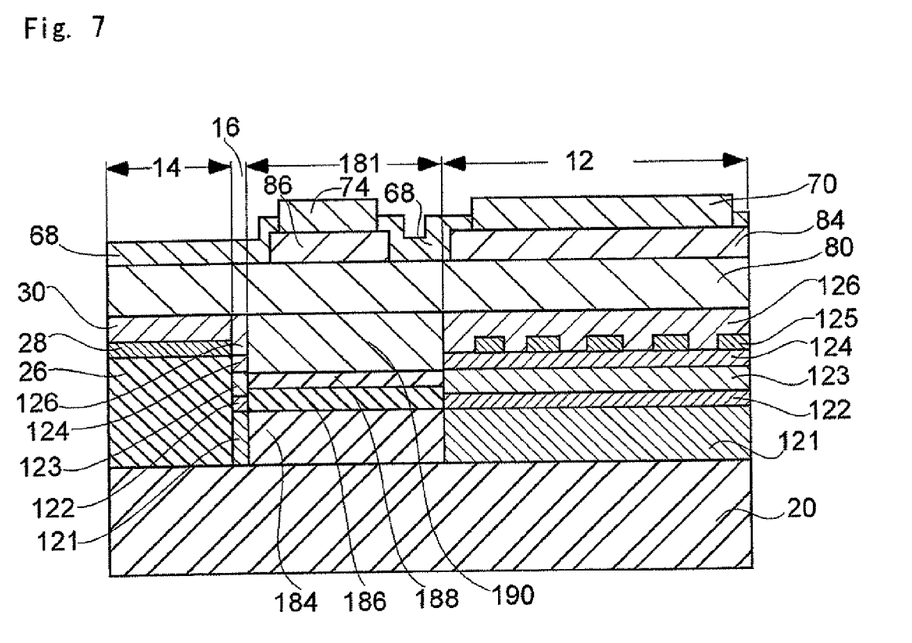
FIG. 7 is a sectional view of the integrated optical semiconductor device of FIG. 6 at a VII-VII section.

FIG. 7 is a sectional view of the integrated optical semiconductor device of FIG. 6 at a VII-VII section.

The basic laminated portion of the semiconductor laser portion 12 has an n-InGaAsP layer 121, an active layer 122 of a multiquantum well structure, a p-InGaAsP layer 123, a p-InP layer 124, a diffraction grating layer 125 of the InGaAsP layer discretely formed on the p-InP layer 124 at a predetermined pitch in a waveguide direction of light, and a p-InP layer 126 filling spaces between diffraction gratings and covering the diffraction grating layer 125, which are laminated and sequentially placed on the n-InP substrate 20.

The n-InGaAsP layer 121, active layer 122 and p-InGaAsP layer 123 of the semiconductor laser portion 12 configure the first laminated structure, and the p-InP layer 124 as a cladding layer, diffraction grating layer 125 and p-InP layer 126 as a cladding layer configure the second laminated structure.

The basic laminated portion of the window layer structure portion 14 is configured by an i-InP layer 26 as a semiconductor layer located on the n-InP substrate 20, an i-InGaAsP layer 28 located on the i-InP layer 26, and an i-InP layer 30 located on the i-InGaAsP layer 28.

The basic laminated portion of the first inter-element portion 16 is laminated in the same process as the basic laminated portion of the semiconductor laser portion 12, and it has the n-InGaAsP layer 121, active layer 122, p-InGaAsP layer 123, p-InP layer 124 and p-InP layer 126 laminated therein. FIG. 7 does not show the diffraction grating layer 125 of the InGaAsP layer in the basic laminated portion of the first inter-element portion 16. However, the diffraction grating layer 125 may also include in the first inter-element portion 16.

The thickness of the first inter-element portion 16 in a longitudinal direction, that is, in the optical axis direction of the optical element ridge portion 62 is 2 µm to 5 µm for instance.

The basic laminated portion of the optical modulator 181 is configured by an n-InGaAsP layer 184, a light absorbing layer 186, a p-InGaAsP layer 188 and a p-InP layer 190 sequentially located on the InP substrate 20.

Top surfaces of the p-InP layer 126 of the semiconductor laser portion 12, the InP layer 30 of the window layer structure portion 14, the p-InP layer 126 of the first inter-element portion 16 and the p-InP layer 190 of the optical modulator 181 are formed to be approximately the same plane. A p-InP layer 80 is placed on these surfaces. A contact layer 84 and a contact layer 86 are individually formed on the surface of the p-InP layer 80 correspondingly to the semiconductor laser portion 12 and the optical modulator 181 respectively.

The insulating film 68 is located on the surfaces of the semiconductor laser portion 12, the optical modulator 181, the window layer structure portion 14 and the first inter-element portion 16 including the contact layer 84 and contact layer 86. The insulating film 68 has an opening provided on a part of the surface of each of the contact layer 84 and contact layer 86. Electrical connections are made via these openings between the contact layer 84 and the p-electrode 70 of the semiconductor laser portion 12 and between the contact layer 86 and the high-potential electrode 74 of the optical modulator 181.

Figure 8:
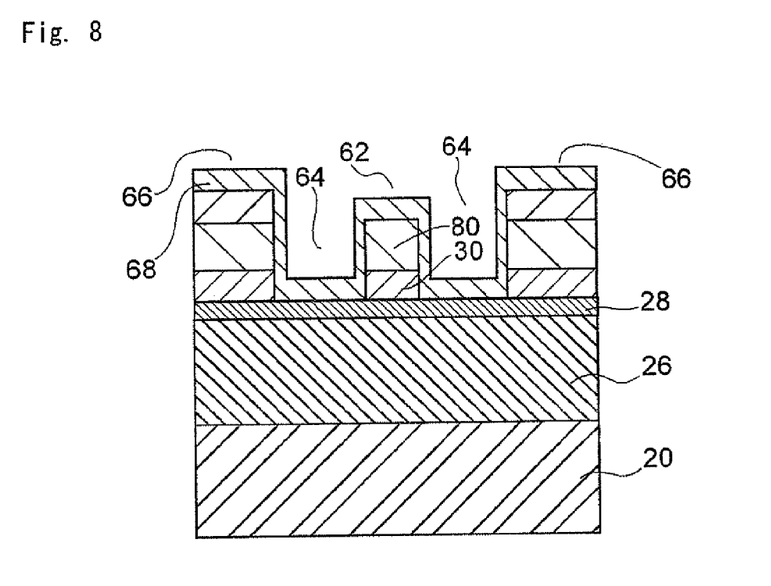
FIG. 8 is a sectional view of the integrated optical semiconductor device of FIG. 6 at a VIII to VIII section.

FIG. 8 is a sectional view of the integrated optical semiconductor device of FIG. 6 at a VIII to VIII section. FIG. 8 is a sectional view of the window layer structure portion 14 at the section orthogonal to the optical axis of a laser beam.

Figure 9:
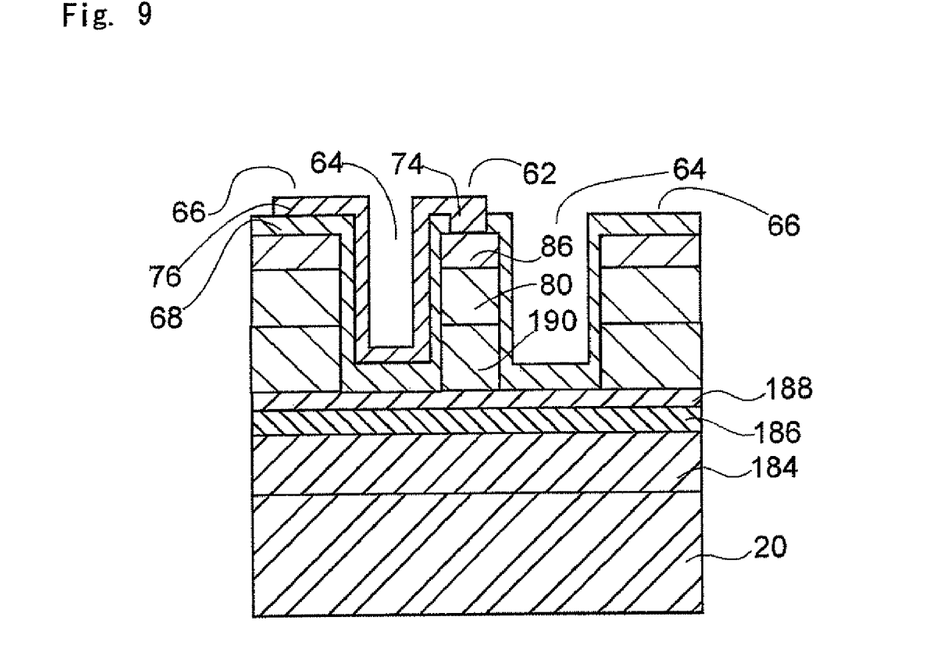
FIG. 9 is a sectional view of the integrated optical semiconductor device of FIG. 6 at an IX to IX section.

FIG. 9 is a sectional view of the integrated optical semiconductor device of FIG. 6 at an IX to IX section. FIG. 9 is a sectional view of the optical modulator 181 at the section orthogonal to the optical axis of the laser beam.

Figure 10:
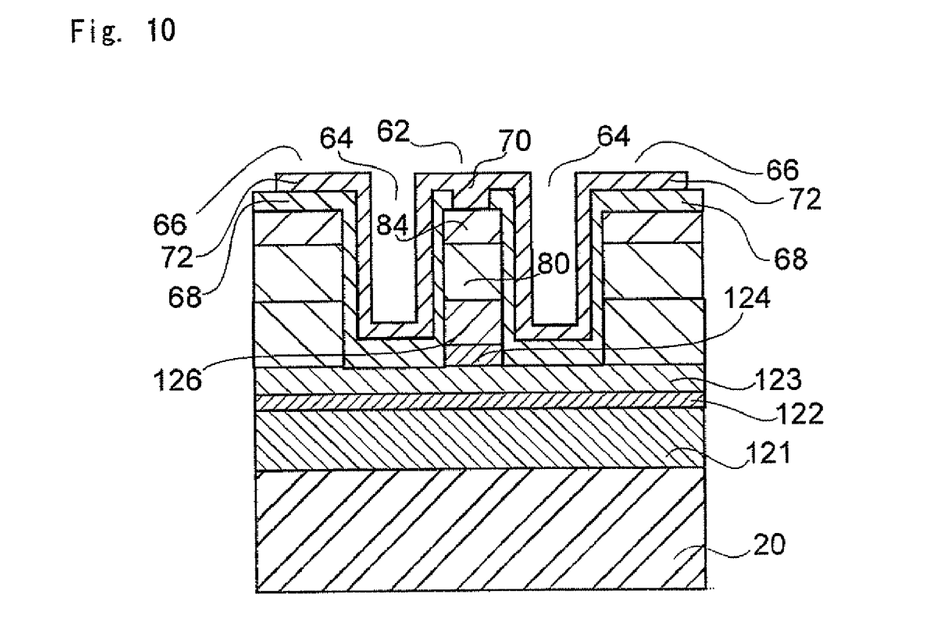
FIG. 10 is a sectional view of the integrated optical semiconductor device of FIG. 6 at an X to X section.

FIG. 10 is a sectional view of the integrated optical semiconductor device of FIG. 6 at an X to X section. FIG. 10 is a sectional view of the semiconductor laser portion 12 at the section orthogonal to the optical axis of the laser beam. FIG. 10 shows a section of the portion having no diffraction grating layer 125.

A sectional view of the first inter-element portion 16 at the section orthogonal to the optical axis of the laser beam is equivalent to the sectional view of FIG. 10 excluding the contact layer 84, the opening of the insulating film 68, the p-electrode 70 and the semiconductor laser electrode pad 72.

In the optical modulator integrated semiconductor laser device 60 thus configured, a voltage has applied between an n-electrode (not shown) and the p-electrode 70 connected to the n-InP substrate 20, and a laser oscillation is excited along with it. The emitted laser beam is modulated by the optical modulator 181 due to an RF voltage applied between the n-side electrode (not shown) and the high-potential electrode 74 connected to the n-InP substrate 20 so as to be emitted as signal light by way of the window layer structure portion 14.

Next, the manufacturing method of the optical modulator integrated semiconductor laser device 60 will be described.

FIGS. 11, 12, 13, 14, 15 and 16 are sectional views of the integrated optical semiconductor device in one process of the manufacturing method of the integrated optical semiconductor device according to an embodiment of the present invention.

Figure 11:
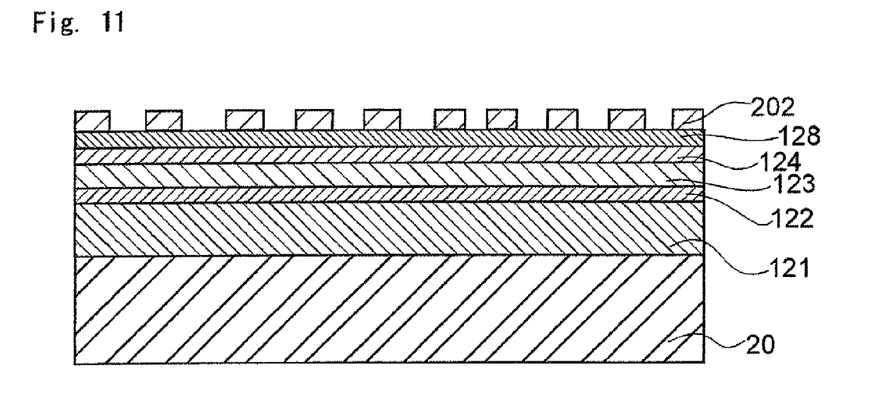
FIGS. 11, 12, 13, 14, 15 and 16 are sectional views of the integrated optical semiconductor device in one process of the manufacturing method of the integrated optical semiconductor device according to an embodiment of the present invention.

With reference to FIG. 11, first, the n-InGaAsP layer 121, the active layer 122 of the multiquantum well structure, the p-InGaAsP layer 123, the p-InP layer 124, and an InGaAsP layer 128 as the diffraction grating layer 125 on the n-InP substrate 20 are sequentially formed by epitaxial growth.

Next, an silicon oxide film such as $SiO_2$ is formed on the surface of the InGaAsP layer 128 and a resist film is applied to the surface of the silicon oxide film. Thereafter, by applying an interference exposure method or an electron beam exposure method, a diffraction grating pattern is rendered to form a resist pattern in the same form as the diffraction pattern. the silicon oxide film is etched with the resist pattern as the mask until the surface of the InGaAsP layer 128 is exposed so as to form an silicon oxide film pattern 202 in the same form as the diffraction grating pattern. Next, the resist pattern is eliminated. FIG. 11 shows the result of this process.

Figure 12:
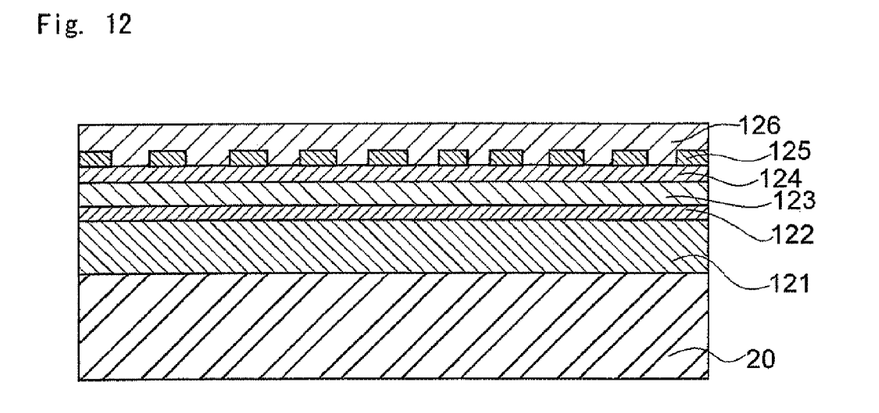

With reference to FIG. 12, in the next, the etching is performed with the silicon oxide film pattern 202 as the mask until the surface of the p-InP layer 124 is exposed so as to form the diffraction grating layer 125. Next, the diffraction grating layer 125 is embedded with p-InP to further form the laminated p-InP layer 126. In other words, spaces between diffraction gratings is filled and the diffraction grating layer 125 is covered by the p-InP layer 126. FIG. 12 shows the result of this process.

Figure 13:
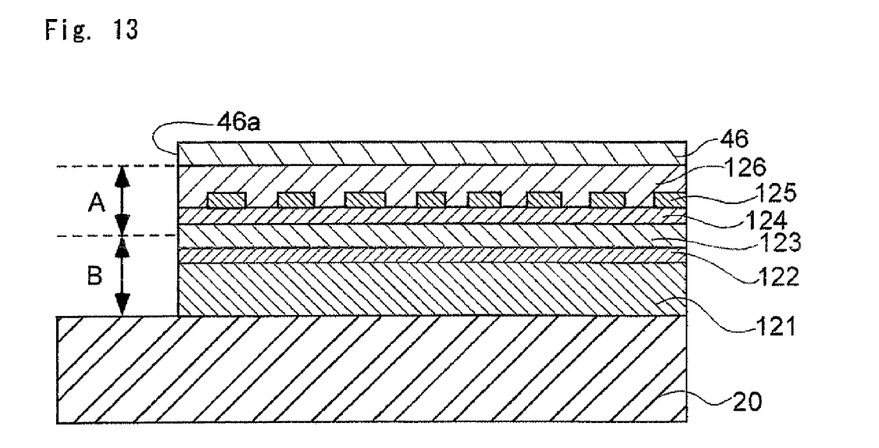

With reference to FIG. 13, in the next the silicon oxide film is formed on the surface of the p-InP layer 126 and the resist film is applied to the surface of the silicon oxide film. Thereafter, by applying the interference exposure method or the electron beam exposure method, the resist pattern is formed. The resist pattern has an opening in the portion corresponding to the region for forming the window layer structure portion 14 located at the most front end on the optical axis of the optical modulator integrated semiconductor laser device 60. The etching is carried out with the resist pattern as the mask, and a silicon oxide film pattern 46 is formed. The silicon oxide film pattern 46 has the opening 46a in the portion corresponding to the region for forming the window layer structure portion 14.

Next, after eliminating the resist pattern, by the nonselective etching such as the dry etching using the reactive ion for instance with the silicon oxide film pattern 46 as the mask, the p-InP layer 126, diffraction grating layer 125 and p-InP layer 124 are completely eliminated and further a part of the thickness of the top surface side of the p-InGaAsP layer 123 is eliminated. This nonselective etching is performed by the etching in the depth control based on the etching time. A region A of FIG. 13 indicates the region etched by the nonselective etching.

Furthermore, the rest of the p-InGaAsP layer 123, the active layer 122 and the n-InGaAsP layer 121 are subsequently eliminated by the selective etching with the etchant such as the tartaric acid. As the tartaric acid is an etchant rapidly reactive to InGaAsP and slowly reactive to InP so that it is selective between the n-InGaAsP layer 121 and the n-InP substrate 20 to allow the selective etching. Consequently, the etching depth is prescribed more accurately than that in the control based on etching time. A region B of FIG. 13 indicates the region etched by the selective etching. FIG. 13 shows the result of this process.

Figure 14:
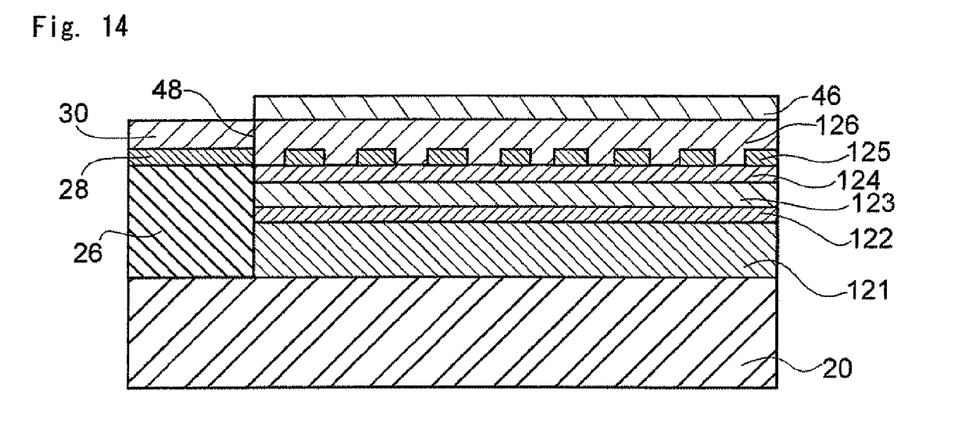

With reference to FIG. 14, in the next the i-InP layer 26, the i-InGaAsP layer 28 and the i-InP layer 30 of the window layer structure portion 14 are sequentially formed and buried on the n-InP substrate 20 by the epitaxial growth with the silicon oxide film pattern 46 as the mask. In this case, the first butt-joint 48 is formed so that the window layer structure portion 14 and the semiconductor laser portion 12 share the optical axis. FIG. 14 shows the result of this process.

Optical modulator 181 is formed in the next.

Figure 15:
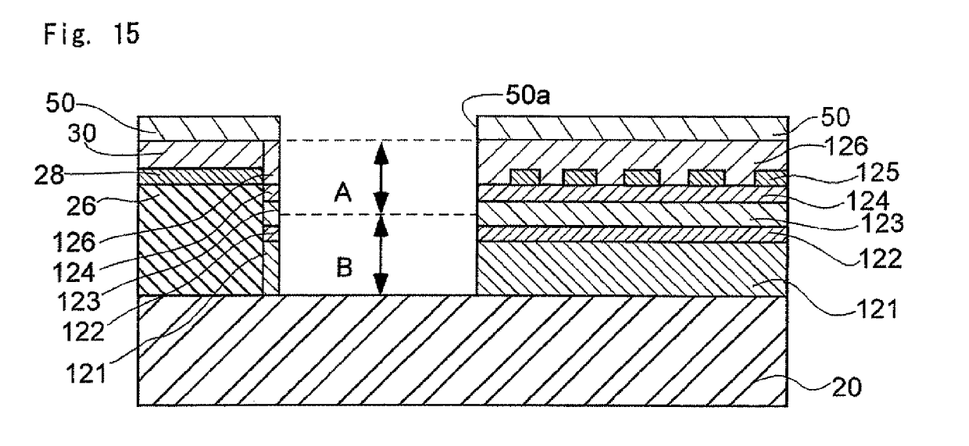

With reference to FIG. 15, after the silicon oxide film pattern 46 is eliminated, an silicon oxide film is formed on the surfaces of the i-InP layer 30 of the window layer structure portion 14 and p-InP layer 126, and a resist film is applied to the surface of the silicon oxide film. Thereafter, by applying the interference exposure method or the electron beam exposure method, the resist pattern is formed, the resist pattern covers the window layer structure portion 14 and the portion corresponding to the regions for forming and the first inter-element portion 16, and has an opening in the portion corresponding to the region for forming the optical modulator 181. In the next, the etching is performed with the resist pattern as the mask until the surface of the p-InP layer 126 is completely exposed, and the silicon oxide film pattern 50 is formed, the silicon oxide film pattern 50 having the opening 50a in the portion corresponding to the region for forming the optical modulator 181.

Next, by the nonselective etching such as the dry etching using the reactive ion for instance with the silicon oxide film pattern 50 as the mask, the p-InP layer 126, diffraction grating layer 125 and p-InP layer 124 are completely eliminated, and further a part of the thickness of the top surface side of the p-InGaAsP layer 123 is eliminated. This nonselective etching is performed by the etching in the depth control based on the etching time. A region A of FIG. 15 indicates the region etched by the nonselective etching.

Furthermore, the rest of the p-InGaAsP layer 123, the active layer 122 and the n-InGaAsP layer 121 are subsequently performed by the selective etching with the etchant such as the tartaric acid. As the etching is performed by the selective etching, the etching depth is accurately prescribed. A region B of FIG. 15 indicates the region etched by the selective etching. FIG. 15 shows the result of this process.

Figure 16:
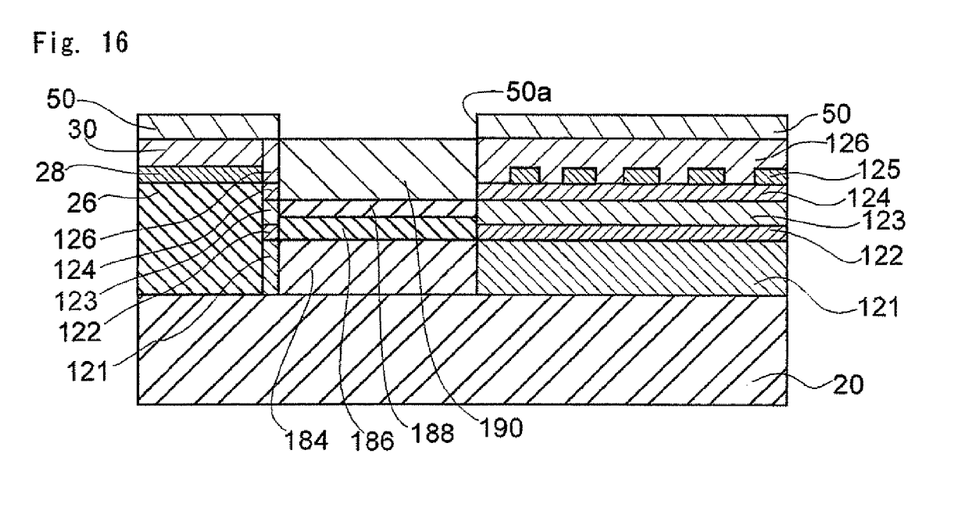

With reference to FIG. 16, in the next the n-InGaAsP layer 184, light absorbing layer 186, p-InGaAsP layer 188 and p-InP layer 190 are sequentially formed and filled on the surface of the n-InP substrate 20 exposed by the etching with the silicon oxide film pattern 50 as the mask by the epitaxial growth. In this case, the butt-joints are formed so that the optical modulator 181, the first inter-element portion 16 and the semiconductor laser portion 12 share the optical axis. FIG. 16 shows the result of this process.

Next, the silicon oxide film pattern 50 is eliminated. The top surfaces of the p-InP layer 126 of the semiconductor laser portion 12, the InP layer 30 of the window layer structure portion 14, the p-In? layer 126 of the first inter-element portion 16 and the p-InP layer 190 of the optical modulator 181 are formed to be approximately the same plane. A p-InP layer 80 is formed on these surfaces by the epitaxial growth.

Furthermore, the contact layer 84 and contact layer 86 are individually formed on the surface of the p-InP layer 80 correspondingly to the semiconductor laser portion 12 and the optical modulator 181 respectively.

Next, the isolation grooves 64 are formed by etching, so the optical element ridge portion 62 is formed. In the next he insulating film 68 is formed on the surface of the p-InP layer 80, the contact layer 84 and the contact layer 86.

Next, openings of the insulating film 68 are formed on the surfaces of the contact layer 84 and contact layer 86 respectively. The p-electrode 70 and the semiconductor laser electrode pad 72 electrically connected to the contact layer 84 via the opening are formed on the insulating film 68. The high-potential electrode 74 and the high-potential electrode pad 76 electrically connected to the contact layer 86 via the opening are also formed likewise on the insulating film 68. Thus, the optical modulator integrated semiconductor laser device 60 shown in FIGS. 6, 7, 8, 9 and 10 is formed.

According to the manufacturing method of the optical modulator integrated semiconductor laser device 60, the etching is performed by leaving the first inter-element portion 16 on forming the basic laminated portion of the optical modulator 181. For this reason, as for the etching on forming the basic laminated portion of the optical modulator 181, it is possible, as with the etching of the region for forming the window layer structure portion 14, to perform the nonselective etching first and then perform the selective etching using selectivity of the n-InGaAsP layer 121 and the n-InP substrate 20. Therefore, the controllability of the etching depth is improved.

Consequently, the basic laminated portion of the optical modulator 181 formed by the lamination process performed following the etching can be formed with reduced position errors in the thickness direction of the lamination layer. Therefore, the basic laminated portion of the optical modulator 181 has little deviation of the optical axis from the window layer structure portion 14 and the semiconductor laser portion 12 located in front and in rear of the optical modulator 181. Therefore, the optical modulator integrated semiconductor laser device 60 has losses due to deviations of the optical axis reduced, and the yield is also improved. Thus, it is possible to obtain the optical modulator integrated semiconductor laser device 60 of a simple configuration of leaving the first inter-element portion 16, low cost and high operation efficiency.

Figure 17:
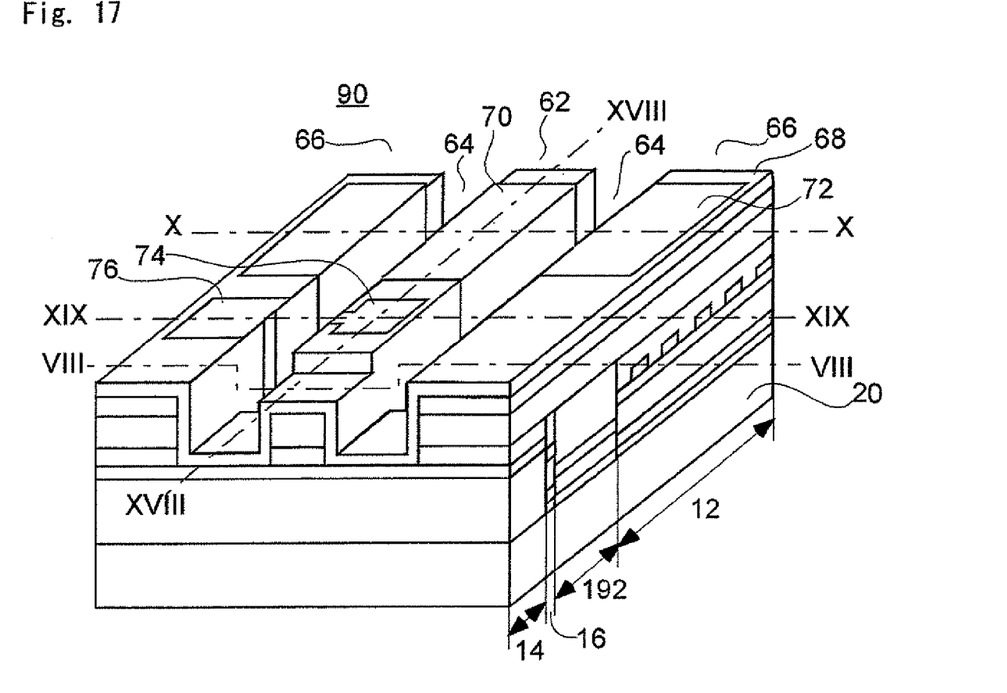
FIG. 17 is a perspective view of a variation of the integrated optical semiconductor device according to an embodiment of the present invention.

FIG. 17 is a perspective view of a variation of the integrated optical semiconductor device according to an embodiment of the present invention.

In FIG. 17, an optical amplifier integrated semiconductor laser device 90 as the integrated optical semiconductor device has the same configuration as the optical modulator integrated semiconductor laser device 60 except that the optical modulator 181 of the optical modulator integrated semiconductor laser device 60 is replaced by an optical amplifier 192.

Figure 18:
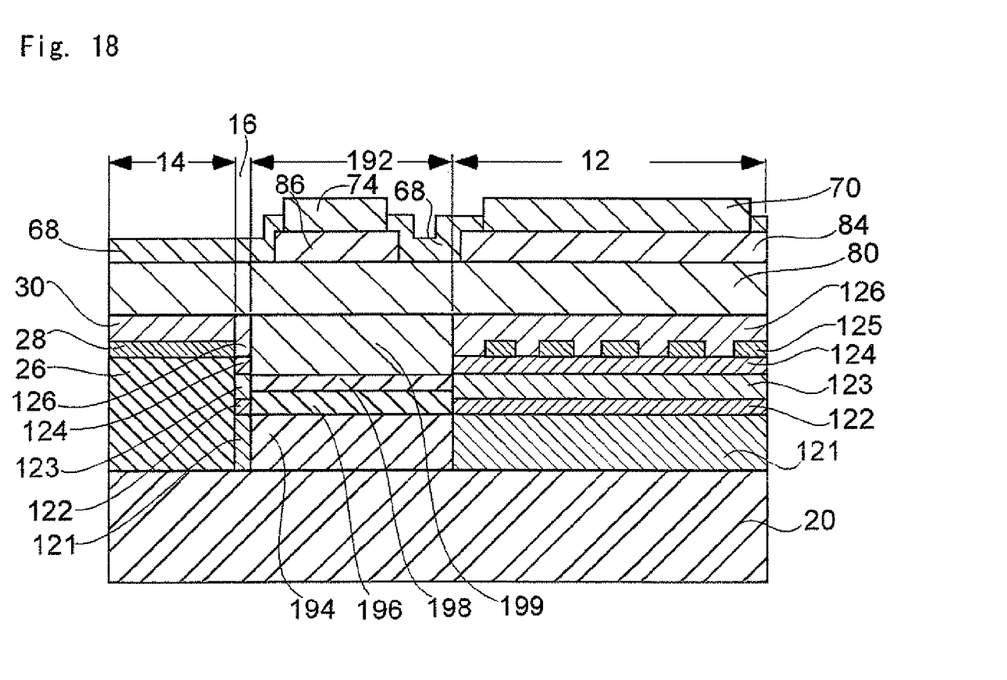
FIG. 18 is a sectional view of the integrated optical semiconductor device of FIG. 17 at a XVIII-XVIII section.

FIG. 18 is a sectional view of the integrated optical semiconductor device of FIG. 17 at a XVIII-XVIII section.

In FIG. 18, the configuration of the semiconductor laser portion 12, window layer structure portion 14 and first inter-element portion 16 is the same as the optical modulator integrated semiconductor laser device 60 shown in FIG. 7.

The basic laminated portion of the optical amplifier 192 is configured by an n-InGaAsP layer 194, an active layer 196 of the multiquantum well structure, a p-InGaAsP layer 198 and a p-InP layer 199 sequentially formed on the n-InP substrate 20.

The top surfaces of the p-InP layer 126 of the semiconductor laser portion 12, the InP layer 30 of the window layer structure portion 14, the p-InP layer 126 of the first inter-element portion 16 and the p-InP layer 199 of the optical amplifier 192 are formed to be approximately the same plane. The p-InP layer 80 is located on these surfaces. The contact layer 84 and contact layer 86 are individually formed on the surface of the p-InP layer 80 correspondingly to the semiconductor laser portion 12 and the optical amplifier 192 respectively.

The insulating film 68 is located on the surfaces of the semiconductor laser portion 12, the optical amplifier 192, the window layer structure portion 14 and the first inter-element portion 16 including the contact layer 84 and contact layer 86. The insulating film 68 has an opening provided on the surface of each of the contact layer 84 and contact layer 86. Electrical connections are made via these openings between the contact layer 84 and the p-electrode 70 of the semiconductor laser portion 12 and between the contact layer 86 and the high-potential electrode 74 of the optical amplifier 192.

Figure 19:
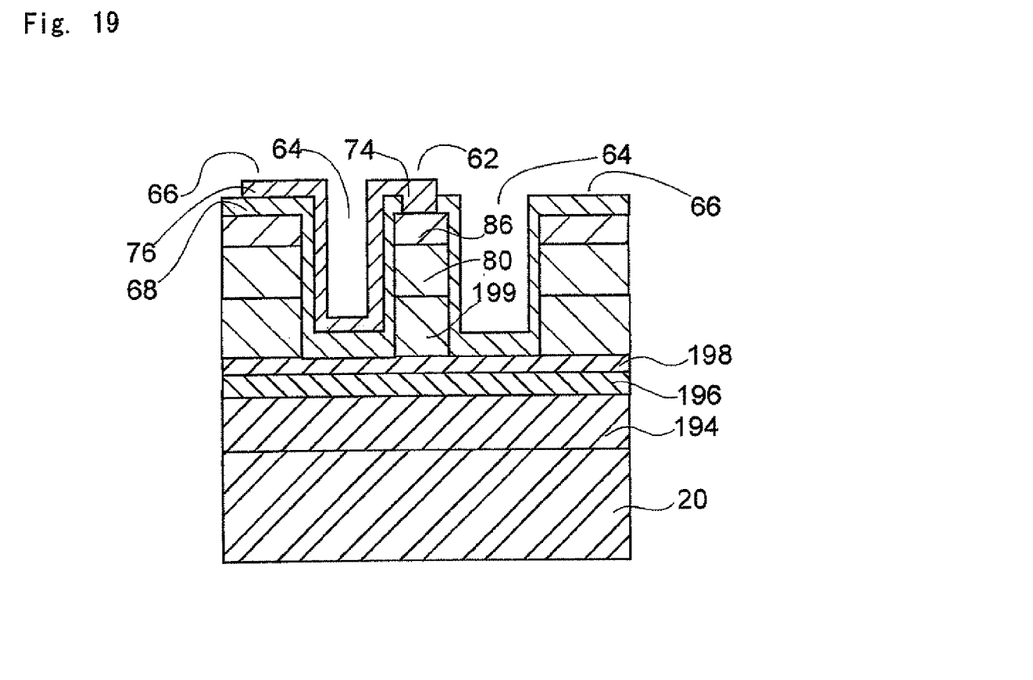
FIG. 19 is a sectional view of the integrated optical semiconductor device of FIG. 17 at a XIX to XIX section.

FIG. 19 is a sectional view of the integrated optical semiconductor device of FIG. 17 at a XIX to XIX section. FIG. 19 is a sectional view of the optical amplifier 192 at the section orthogonal to the optical axis of the laser beam.

The sectional view at the VIII to VIII section and the sectional view at the X to X section of the integrated optical semiconductor device of FIG. 17 are the same as FIGS. 9 and 10 respectively.

The sectional view of the first inter-element portion 16 at the section orthogonal to the optical axis of the laser beam is equivalent to the sectional view of FIG. 10 excluding the contact layer 84, the p-electrode 70 and the semiconductor laser electrode pad 72.

The manufacturing method of the optical amplifier integrated semiconductor laser device 90 is different from the manufacturing method of the optical modulator integrated semiconductor laser device 60 as to the process of sequentially laminating the n-InGaAsP layer 194, the active layer 196 of the multiquantum well structure, the p-InGaAsP layer 198 and the p-InP layer 199 as the basic laminated portion of the optical amplifier 192 on the n-InP substrate 20. The other processes are the same as those of the manufacturing method of the optical modulator integrated semiconductor laser device 60.

Figure 20:
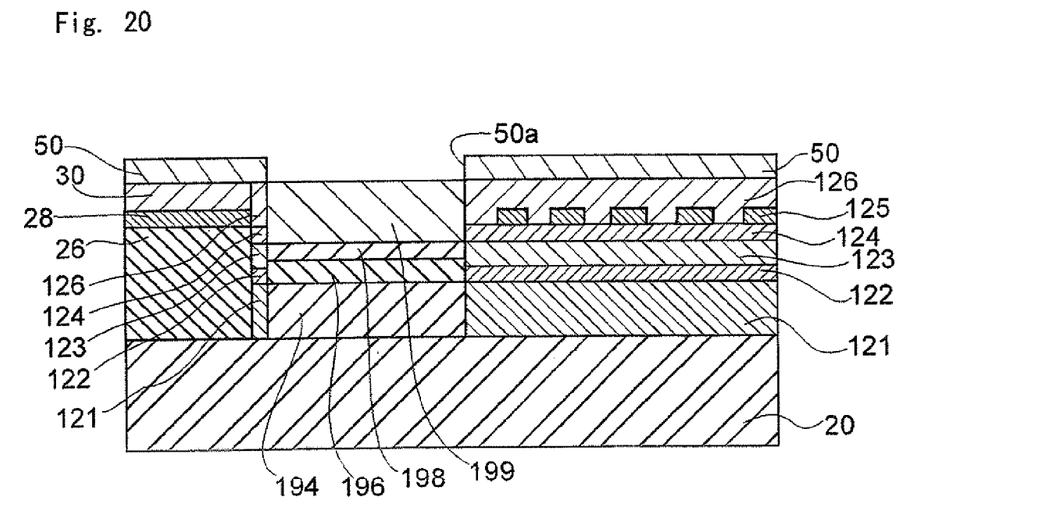
FIG. 20 is a sectional view of the integrated optical semiconductor device in a process of the manufacturing method of a deformed example of the integrated optical semiconductor device according to an embodiment of the present invention.

FIG. 20 is a sectional view of the integrated optical semiconductor device in a process of the manufacturing method of a deformed example of the integrated optical semiconductor device according to an embodiment of the present invention.

In FIG. 20, the n-InGaAsP layer 194, the active layer 196 of the multiquantum well structure, the p-InGaAsP layer 198 and the p-InP layer 199 are sequentially formed and filled on the surface of the n-InP substrate 20 exposed by etching by the epitaxial growth with the silicon oxide film pattern 50 as the mask. In this case, the butt-joints are formed so that the optical amplifier 192, the first inter-element portion 16 and the semiconductor laser portion 12 share the optical axis. FIG. 20 shows the result of this process. The processes before and after this process are the same as those of the manufacturing method of the optical modulator integrated semiconductor laser device 60.

According to the manufacturing method of the optical amplifier integrated semiconductor laser device 90, the etching is performed by leaving the first inter-element portion 16 on forming the basic laminated portion of the optical amplifier 192. For this reason, as for the etching on forming the basic laminated portion of the optical amplifier 192, it is possible, as with the etching of the region for forming the window layer structure portion 14, to perform the nonselective etching first and then perform the selective etching using selectivity of the n-InGaAsP layer 121 and the n-InP substrate 20. Therefore, the controllability of the etching depth is improved.

Consequently, the basic laminated portion of the optical amplifier 192 formed by the lamination process performed following the etching can be formed with reduced position errors in the thickness direction of the lamination layer. Therefore, the basic laminated portion of the optical amplifier 192 has little deviation of the optical axis from the window layer structure portion 14 and the semiconductor laser portion 12 located in front and in rear of the optical amplifier 192. Therefore, the optical amplifier integrated semiconductor laser device 90 has losses due to deviations of the optical axis reduced, and the yield is also improved. Thus, it is possible to obtain the optical amplifier integrated semiconductor laser device 90 of a simple configuration of leaving the first inter-element portion 16, low cost and high operation efficiency.

As described above, the integrated optical semiconductor device and the manufacturing method thereof according to the present invention are suited for the integrated optical semiconductor device monolithically formed by opposing and joining three or more kinds of optical elements especially in an optical axis direction and the manufacturing method thereof.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. An integrated optical semiconductor device comprising:
   a semiconductor substrate;
   a first optical semiconductor element structure including a first laminated structure consisting of one layer or multiple layers, selectively located on the semiconductor substrate, and forming a first heterojunction with the semiconductor substrate, and a second laminated structure consisting of one layer or multiple layers, located on the first laminated structure, and forming a second heterojunction with the first laminated structure, the first laminated structure having a higher etching rate than the etching rate of the semiconductor substrate with respect to a predetermined etchant;
   a second optical semiconductor element structure having a double heterojunction structure with the same optical axis direction as the first optical semiconductor element structure, having an first end face, orthogonal to the optical axis, on a side facing the first optical semiconductor element structure, located on the semiconductor substrate, and spaced from the first optical semiconductor element structure;
   an inter-optical semiconductor element structure in contact with the first end face, located on the semiconductor substrate, having the first laminated structure and the second laminated structure, a thickness of 100 μm or less in the optical axis direction, and having an second end face orthogonal to the optical axis on a side facing the first optical semiconductor element structure; and
   a third optical semiconductor element structure having a double heterojunction structure, in contact with the second end face, located on the semiconductor substrate, and having the same optical axis direction as the first optical semiconductor element structure.

2. The integrated optical semiconductor device according to claim 1, wherein the second optical semiconductor element structure includes a semiconductor layer forming a heterojunction with the semiconductor substrate, and having an etching rate comparable to the etching rate of the semiconductor substrate for a predetermined etchant, the integrated optical semiconductor device further comprising:
   a third laminated structure consisting of one layer or multiple layers on the semiconductor layer and of the same material as the first laminated structure; and
   a fourth laminated structure consisting of one layer or multiple layers on the third laminated structure and forming a heterojunction with the third laminated structure.

3. The integrated optical semiconductor device according to claim 2, wherein the third laminated structure includes:
   a fifth laminated structure consisting of one layer or multiple layers, located on the semiconductor substrate, forming a third heterojunction with the semiconductor substrates, and of the same material as the first laminated structure; and
   a sixth laminated structure consisting of one layer or multiple layers, located on the fifth laminated structure, and forming a fourth heterojunction with the fifth laminated structure.

4. The integrated optical semiconductor device according to claim 1, wherein the first optical semiconductor element structure is a semiconductor laser structure with an active layer included in the first laminated structure and a cladding layer included in the second laminated structure.

5. The integrated optical semiconductor device according to claim 4, including a diffraction grating located in the second laminated structure.

6. The integrated optical semiconductor device according to claim 1, wherein the semiconductor substrate is InP and the first laminated structure includes InGaAsP.

* * * * *